United States Patent [19]

Krueger et al.

[11] Patent Number: 4,820,586
[45] Date of Patent: Apr. 11, 1989

[54] PYROELECTRIC AND ISOTROPIC PIEZOELECTRIC POLYMER BLENDS

[75] Inventors: Dennis L. Krueger, Hudson, Wis.; Neil W. Loeding, Mounds View; Claudia I. Poser, St. Paul, both of Minn.

[73] Assignee: Minnesota Mining and Manufacturing Company, St. Paul, Minn.

[21] Appl. No.: 112,364

[22] Filed: Oct. 26, 1987

Related U.S. Application Data

[63] Continuation of Ser. No. 832,965, Feb. 25, 1986, abandoned, which is a continuation of Ser. No. 720,459, Apr. 5, 1985, abandoned, which is a continuation-in-part of Ser. No. 273,901, Jun. 19, 1981, abandoned, which is a continuation-in-part of Ser. No. 171,299, Jul. 23, 1980, abandoned.

[51] Int. Cl.$^4$ ............... C08L 27/08; B32B 15/08; B32B 27/28
[52] U.S. Cl. .................. 428/421; 427/100; 525/199
[58] Field of Search ............ 525/199; 428/421

[56] References Cited

U.S. PATENT DOCUMENTS

| | | |
|---|---|---|
| 3,607,754 | 9/1971 | Ashina et al. ............. 252/63.2 |
| 3,790,645 | 2/1974 | Murayama et al. .......... 260/884 |
| 3,833,503 | 9/1974 | Murayama et al. .......... 252/63.7 |

OTHER PUBLICATIONS

Bloomfield et al–Piezo- & Pyroelectricity in Poly(-Vinylidene Fluoride)–Navy Res. Rev. vol. 31, No. 5 (May 1978) pp. 1, 5, 7 & 8.
Seanor–Electrical Prop. of Polymers–Academic Press, (1982), pp. 257-263.

Primary Examiner—Carman J. Seccuro
Attorney, Agent, or Firm—Donald M. Sell; Walter N. Kirn; Darla P. Neaveill

[57] ABSTRACT

A pyroelectric and isotropic piezoelectric polymeric film, the film being formed from a blend of polyvinylidene fluoride and at least one polymer miscible therewith, and prepared by forming the film, heating it to a temperature sufficient to render the film substantially amorphous, cooling at a rate and to a temperature sufficient to prevent crystallization, and polarizing the film to render same $\beta$-crystalline and pyroelectric and isotropically piezoelectric.

4 Claims, No Drawings

PYROELECTRIC AND ISOTROPIC PIEZOELECTRIC POLYMER BLENDS

This is a continuation of application Ser. No. 832,965, filed Feb. 25, 1986, now abandoned, which is a continuation of application Ser. No. 720,459, filed Apr. 5, 1985, which is a continuation-in-part of Ser. No. 273,901, filed June 19, 1981, which is a continuation-in-part of Ser. No. 171,299, filed July 23, 1980; all now abandoned.

TECHNICAL FIELD

The invention relates to a polymeric film or coating which displays stable pyroelectric and isotropic piezoelectric properties, and more particularly relates to a blend of polymers which allows the formation of a pyroelectric and isotropic piezoelectric film without the necessity of mechanical orientation, i.e., the mechanical stretching or elongation, of the film.

BACKGROUND ART

Certain polymeric films have been found to exhibit pyroelectric properties, i.e., to exhibit electrical polarization reversibly with a change in temperature of the material, with the amount of polarization being directly proportional to the temperature change, and piezoelectric properties, i.e., electric polarization as a response to mechanical strain, with the amount of polarization being directly proportional to the mechanical strain applied. To form a pyroelectric and piezoelectric element from these polymer films, same are typically exposed to an intense electric field (a process known as "poling").

In some instances, the foregoing element has also been termed an "electret". For example, U.S. Pat. Nos. 3,794,986 and 3,833,503 discuss this concept of an electret in the broad sense as being any element capable of retaining an electric polarization, whether this polarization is on the outside or the inside of the polymeric material. The term "electret" is also utilized in a more narrow sense as a substance wherein an electric field is formed on the outside of the material only. Thus, in the narrow sense the term is characterized by the display of a surface charge density, as is discussed in U.S. Pat. No. 3,607,754, together with the foregoing references. An electret in the narrow sense, i.e., that displaying a surface charge density, is not capable of providing stable pyroelectric and piezoelectric characteristics. As foregoing U.S. Pat. No. 3,833,503 discusses, in order to achieve a pyroelectric element having stable pyroelectricity, the macroscopic polarization by the space charges in the electret must be depolarized. The reference goes on to indicate that in order to achieve stable pyroelectric characteristics, the space charges, or the surface charge on the conventional electret in the narrow sense discussed above, must be first removed. This macroscopic polarization is depolarized, as taught in this reference, by short circuiting the opposite sides of the electret for a sufficient time at an elevated temperature or for a longer time if ambient temperatures are utilized. Furthermore, as discussed in U.S. Pat. No. 3,794,986, when the temperature of such an electret in the narrow sense is elevated, reproduceable, i.e., stable, pyroelectricity is not obtained.

Therefore, to form an element having stable pyroelectric and piezoelectric characteristics, most of the surface charge introduced during the poling process is typically drained from the element by shorting out the electrodes on both sides of the film. Such a procedure would, of course, destroy any electret properties in the narrow sense as discussed above.

To summarize, the word "electret" as commonly used refers to an electret in the narrow sense, i.e., a material which exhibits a permanent surface charge density. An electret in this narrow sense cannot be equated to a stable pyroelectric and piezoelectric element.

One film which has been found capable of providing stable pyroelectric and piezoelectric elements is comprised of polyvinylidene fluoride. It is widely known in the literature that the formation of an element displaying stable pyroelectric and piezoelectric properties from polyvinylidene fluoride requires that a film of the appropriate crystalline structure (preferably beta crystallinity, although gamma crystallinity is acceptable) must be prepared prior to the poling operation. Polyvinylidene fluoride, when manufactured in film form, such as by an extruder, etc., has a crystalline structure which is of the alpha type. It has been found, however, that the alpha crystalline form is not capable of being poled to provide a useful stable pyroelectric and piezoelectric element. This is true because these characteristics arise directly from the presence of specific types of symmetry in the crystals within the structure. Beta and gamma crystallites possess the appropriate symmetry while alpha crystallites do not.

In order to produce a film capable of being poled to produce the requisite and desired stable electrical characteristics, the films are typically converted to primarily the beta type of crystallinity conventionally by uniaxial or biaxial orientation, i.e., stretching the film in a heated state and retaining same in that stretched state while the film is allowed to cool. The resultant film exhibits beta crystallinity to varying degrees depending on the amount of stretching.

In some cases, this mechanical orientation can be applied simultaneously with the poling process, as is taught in U.S. Pat. No. 4,308,370, so as to form the beta crystallites by stretching and inducing polarization in the same step.

While such mechanical orientation techniques are effective for the production of films which can be poled and thus transformed into stable pyroelectric and piezoelectric elements, the necessity for orientation has several disadvantages: first, such orientation is a costly processing step; second, during orientation an anisotropic film is created which results in anisotropic piezoelectric properties. (Since the most highly piezoelectric elements usually result from highly uniaxially oriented films, the anisotropy can be considerable); third, stable pyroelectric and piezoelectric coatings cannot typically be applied directly onto an article, as by solvent casting, for example, because the coating cannot typically be oriented once placed on the article.

One approach to solving the aforementioned problems is disclosed in U.K. Pat. No. 1,349,860. Therein is taught the concept of use of a vinylidene fluoride copolymer to achieve a stable pyroelectric and piezoelectric element. The addition of a comonomer to the vinylidene fluoride monomer during the polymerization sequence is taught to provide a film apparently containing the requisite crystalline structure for subsequent poling to provide stable pyroelectric and piezoelectric characteristics thereto. With this system, somewhat lengthy polarization times, i.e., about 2 hours, are disclosed.

While the reference teaches that shorter times can be used, lengthier times are taught to be preferred.

We have discovered that if the polyvinylidene fluoride polymer can be maintained in an amorphous state prior to poling, the poling process by itself results in an element displaying stable pyroelectric and piezoelectric properties. Apparently, the poling itself creates the desired β-crystallinity in the film or coating, with no necessity for mechanical orientation.

The prevention of crystalline formation is achieved by utilizing a polymeric blend, with one of the polymers being polyvinylidene fluoride and the other polymer being one that is miscible therewith.

By keeping the miscible polymer blend in an amorphous state until poling is undertaken, beta crystallinity, and thus the desired electrical characteristics are achieved solely by the action of the polarization. Such a technique cannot be applied to pure polyvinylidene fluoride because the pure polymer has such a high tendency to crystallize that crystallization cannot be sufficiently prevented.

The function of the miscible polymeric blend component is therefore to reduce the tendency of the polyvinylidene fluoride to crystallize and thus to form a substantially amorphous film prior to poling.

The use of polymer blends of polyvinylidene fluoride with miscible polymers is itself known in the art. Such polymers include acrylates, e.g., polymethyl acrylate; methacrylates, e.g., polymethyl methacrylate and polyethyl methacrylate; polyvinyl acetate; poly N,-N-dimethyl acrylamide; polyvinyl methyl ketone and poly N-vinyl-2-pyrolidone. Such blends have in fact been mechanically oriented to produce the beta crystalline form of the polyvinylidene fluoride within the blend composition and subsequently poled. One would expect that the desired electrical properties would be less than those of pure polyvinylidene fluoride because less polyvinylidene fluoride is present in the composition, and such experiments have in fact been reported with the expected results. (Lee, H.; Salomon, R. E.; and Laebs, M. N.; *Macromolecules*, 11, p. 171, 1978.)

We have now found that by using a simple blend of polymers, processing same to a film or a coating on an article can be undertaken without the necessity of mechanical orientation of the film, yet a film or coating displaying stable pyroelectric and isotropic piezoelectric characteristics can be obtained.

DISCLOSURE OF THE INVENTION

In accordance with the invention there is provided a polymeric film or coating which displays stable pyroelectric and isotropic piezoelectric properties. These properties are obtained by, for example, either solvent casting or melt blending a suitable polymer blend into film form or coating onto an article, heating the film to a temperature above the melting point of the polyvinylidene fluoride for a sufficient time to render the film substantially amorphous, cooling the film at a rate and to a temperature sufficient to prevent the crystallization of the film, followed by polarization thereof to render the film β-crystalline and pyroelectric and isotropically pizeoelectric. The resultant film is not mechanically oriented and comprises a blend of polyvinylidene fluoride and at least one polymer which is miscible with polyvinylidene fluoride.

BEST MODE FOR CARRYING OUT THE INVENTION

The polyvinylidene fluoride polymer utilized in this invention is of any of those types which are commercially available. Exemplary materials include "Kureha" 1100 (available from Kureha Chemical, "Solvay" 1012 (available from Soltex Polymer Corp.), and "Kynar" 301-F (available from Pennwalt Corp.).

The other polymers suitable for use in the polymer blend includes those which are miscible with polyvinylidene fluoride. Miscibility herein means that the polymer blend exhibits a single glass transition temperature. Exemplary polymers include acrylates, e.g., polymethylacrylate; methacrylates, e.g., polymethylmethacrylate and polyethylmethacrylate; polyvinylacetate; poly N,N-dimethyl acrylamide; poly N-vinyl-z-pyrrolidone; and polyvinyl methyl ketone. These polymers are the only ones taught in the literature to be miscible with polyvinylidene fluoride.

To have preferred practical utility, the pizoelectric and pyroelectric properties should result in polarization on the order of at least about 0.5 volt/°C.-mil.

In order to optimize the pyroelectric and piezoelectric characteristics of the polymer film, the blend should contain at least about 50 percent polyvinylidene fluoride, the balance being the polymers exemplified above.

In the preparation of the polymer film comprising the aforementioned blend, the polymers can be intimately mixed (in batch mixers such as the Banbury-type and roll mill type or in continuous mixers such as single and twin screw extruders) at an elevated temperature, typically called melt blending, until a uniform homogeneous mixture is obtained, following which a film can be prepared from the homogeneous mixture utilizing conventional equipment, such as an extruder, etc.

Alternatively, the polymers can be dissolved in a suitable solvent for application by conventional solvent casting techniques, e.g., spin casting, dip coating, knife coating, roll bar coating, spraying, etc. An exemplary solvent is dimethyl formamide. Solvent casting can be undertaken on articles such as metallic foil, integrated circuits, etc. This technique has special utility for coating an article where requirements such as small size or the necessity of direct electrical communication between article elements precludes the use of prepoled and subsequently adhered film.

In light of the foregoing, the term "film" should be construed to include both a self-supporting web and a coating applied to an article.

The resultant film is then heated to remove the solvent therefrom, as in the case of solvent casting, and then heated to a temperature above the melting point of the polyvinylidene fluoride for sufficient time to render the film substantially amorphous. Following this heating step, the film is cooled at a rate and to a temperature sufficient to prevent the crystallization of the film, followed by poling.

If a metallic substrate is used, same can typically be selected from thin metal or alloy foils, examples of which include aluminum, copper, chromium, various steels, etc. In the case of solvent casting, thin metal films are preferred in order to provide rapid heat transfer so that the solvent from the coating solution will readily evaporate. Furthermore, in the subsequent heating step, after either solvent casting or melt blending, the thin metal film acts as a heat transfer medium to provide rapid cooling and thus prevent crystallization of the polymers in the film. Other substrates useful for receiving the polymer film include glass, ceramic (especially woven or non-woven ceramic fabrics), silicon, etc.

Additionally, the polymer blend can be solvent cast onto selected areas of devices, processed as above, and poled in situ to achieve the β-crystallinity and resultant stable piezoelectric and pyroelectric properties of the polymer blend.

A film may or may not be removed from a metal web and poled by conventional static methods, or the film can be continuously poled as described in U.S. Pat. Nos. 4,067,056; 4,079,437; or 4,089,034. During the poling operation, the substantially amorphous polymeric polyvinylidene fluoride is converted to the beta crystalline form under the influence of the electric field. In this fashion, the resultant polarized film is substantially in the beta crystalline form, without necessity for mechanical orientation of the film, because maintaining the blend in the substantially amorphous form prior to polarization surprisingly avoids the formation of the alpha crystalline form of the polyvinylidene fluoride.

Furthermore, by the use of our process, the resultant polarized film exhibits isotropic piezoelectric properties in the plane of the film. By isotropic piezoelectric properties we mean that the piezoelectric constant $d_{31}$ is equal to $d_{32}$. In defining the piezoelectric constant, designations 1 and 2 correspond to any orthogonal directions in the plane of the film and designation 3 corresponds to a direction perpendicular to the plane of the film.

Alternatively, when mechanical orientation is undertaken to achieve the beta-crystalline form, such equality cannot typically be obtained in commercial practice.

The invention will now be more specifically described by the use of the following non-limiting examples, wherein all parts are by weight unless otherwise specified.

EXAMPLE 1

Mixtures of polyvinylidene fluoride (Kynar ® 301-F from Pennwalt) and polymethylmethacrylate (Rohm and Haas Acryloid ® A-11) were dissolved in dimethylformamide (DMF) by stirring and heating to 120°–160° C. over a three hour period. Films were cast from a portion of the resulting solutions onto 1.0 mil (0.025 mm) thick aluminum foil using a six inch (15.24 cm) draw bar coater. The coated foil was immediately placed on a 150° C. hot plate for 15 minutes to drive off most of the DMF, and then the coated foil was placed in a 150°–200° C. oven for one-half hour. Just prior to poling, the coated foil was heated to 220°–240° C. for 15 minutes and then rapidly cooled to room temperature. The resulting films, which measured about 1.0 mil (0.025 mm) thick, were poled as described in U.S. Pat. Nos. 4,067,056; 4,079,437; or 4,089,034.

| Sample | PVF$_2$[1] | PMMA[2] | DMF[3] | KV[4] | Time[5] (sec.) | p[6] (volts/-mil °C.) |
|---|---|---|---|---|---|---|
| A | 8 | 2 | 40[a] | 6 | 8 | 6.3 |
| B | 8 | 3.4 | 45.6[b] | 6 | 8 | 4.95 |
| C | 7 | 4.7 | 46.8 | 6 | 33 | 0.81 |

[a]Ten grams of DMF were added to the solution just prior to casting
[b]Five grams of DMF were added to the solution just prior to casting
NOTE:
The additions [a] and [b] provided both solutions with about the same viscosity.
[1]PVF$_2$—polyvinylidene fluoride resin, grams
[2]PMMA—polymethylmethacrylate resin, grams
[3]DMF—dimethylformamide, grams
[4]KV—poling voltage, kilovolts
[5]time—residence time in field during poling
[6]p—calculated pyroelectric response for blend

EXAMPLE 2

Mixtures of polyvinylidene fluoride (Solef ® 1012 from Solvay) and polymethylmethacrylate (Rohm and Haas Acryloid ® A-11) were dissolved in dimethylformamide (DMF) by stirring and heating to 120°–160° C. over a three hour period. Films were cast from a portion of the resulting solutions onto 0.6 mil thick aluminum foil using a six inch (15.24 cm) draw bar coater. The coated foil was immediately placed on a 130° C. hot plate for 10 minutes to drive off most of the DMF, and then the coated foil was placed in a press for 10 minutes, the press platens having been heaed to 220° C. A gap of at least one centimeter was maintained between the platens. Immediately after heating and just prior to poling, the films were quenched in ice water. The resulting films, whose thickness varied from 0.8 to 1.1 mil thick, were poled as described in U.S. Pat. Nos. 4,067,056; 4,079,437; or 4,089,034.

| Sample | PVF$_2$[1] | PMMA[2] | DMF[3] | KV[4] | Time[5] (sec.) | p[6] (volts/-mil °C.) |
|---|---|---|---|---|---|---|
| D | 6.5 | 3.5 | 40 | 6 | 8 | 3.1 |
| E | 7.5 | 2.5 | 40 | 6 | 8 | 3.8 |
| F | 9.0 | 1.0 | 40 | 6 | 8 | 3.3 |

[1]PVF—polyvinylidene fluoride resin, grams
[2]PMMA—polymethylmethacrylate resin, grams
[3]DMF—dimethylformamide, grams
[4]KV—poling voltage, kilovolts
[5]time—residence time in field during poling
[6]p—calculated pyroelectric response for blend

EXAMPLE 3

Mixtures of polyvinylidene fluoride (Solef ® 1012 from Solvay) and polyvinyl acetate (CAT No. 346 from Scientific Polymer Products) were dissolved in dimethylformamide (DMF) by stirring and heating to 120°–160° C. over a three hour period. Films were cast from a portion of the resulting solution onto 0.6 mil thick aluminum foil using a six inch (15.25 cm) draw bar coater. The coated film was immediately placed on a 130° C. hot plate for 10 minutes to drive off most of the DMF, and then the coated foil was heated to 220° C. for 10 minutes and then rapidly cooled by quenching in ice water. The resulting films, whose thickness varied from 1.0 to 1.2 mils, were poled as described in U.S. Pat. Nos. 4,067,056; 4,079,437; or 4,089,034.

| Sample | PVF$_2$[1] | PVAc[2] | DMF[3] | KV[4] | Time[5] (sec.) | p[6] (volts/-mil °C.) |
|---|---|---|---|---|---|---|
| A | 6 | 4 | 40 | 6 | 8 | 3.7 |
| B | 7 | 3 | 40 | 6 | 8 | 4.5 |

-continued

| Sample | PVF$_2$[1] | PVAc[2] | DMF[3] | KV[4] | Time[5] (sec.) | p[6] (volts/mil °C.) |
|---|---|---|---|---|---|---|
| C | 8 | 2 | 40 | 6 | 8 | 5.5 |

[1]PVF$_2$—polyvinylidene fluoride resin, grams
[2]PVAc—polyvinyl acetate resin, grams
[3]DMF—dimethylformamide, grams
[4]KV—poling voltage, kilovolts
[5]time—residence time in field during poling
[6]p—calculated pyroelectric response for blend

EXAMPLE 4

Films were prepared as per Example 3 using polyethylmethacrylate (Elvacite® 2042 from DuPont) instead of polyvinyl acetate. Results of this film blend were:

| Sample | PVF$_2$[1] | PEMA[2] | DMF[3] | KV[4] | Time[5] (sec.) | p[6] (volts/mil °C.) |
|---|---|---|---|---|---|---|
| A | 6 | 4 | 40 | 6 | 8 | 5.1 |
| B | 7 | 3 | 40 | 6 | 8 | 4.8 |
| C | 8 | 2 | 40 | 6 | 8 | 4.0 |

[1]PVF$_2$—polyvinylidene fluoride resin, grams
[2]PEMA—polyethyl methacrylate resin, grams
[3]DMF—dimethylformamide, grams
[4]KV—poling voltage, kilovolts
[5]time—residence time in field during poling
[6]p—calculated pyroelectric response for blend

EXAMPLE 5

Polyvinylidene fluoride (240 grams of Kureha 1100), polymethylmethacrylate (110 grams of Rohm & Haas Acryloid® A-11) and 1360 grams of dimethylformamide were charged into a container. The contents were stirred and maintained at a temperature of 200° F. (93° C.) for 20 hours. The resulting solution, when cooled to room temperature, had an acceptable viscosity for knife coating.

The viscous solution was knife coated with a 9 inch knife coater onto one ounce copper foil and the coated film was dried at 275° F. (135° C.) for 1.5 to 3.0 minutes.

The film was subsequently heated to 400° F. (204° C.) for 1.5 to 3.0 minutes and quenched to 95° F. (35° C.) within 8 to 15 seconds. The film was poled as described in U.S. Pat. Nos. 4,067,056; 4,079,437; or 4,089,034 and the resulting pyroelectric response was 2.3 to 4.0 V/mil°C.

EXAMPLE 6

A solution of polyvinylidene fluoride (Solef® 1012, 70 percent by weight) and polymethyl methacrylate (Rohm & Haas Acryloid® A11, 30 percent by weight) in dimethyl formamide was prepared at a solids content of 20 percent by weight. This solution was coated onto 0.6 mil aluminum foil using a 6 inch knife coater, dried at 270° F. for 15 minutes, heated to 425° F. for 10 minutes, and subsequently cooled rapidly. The resulting film, 0.9 mil thick, was poled as described in U.S. Pat. Nos. 4,067,056; 4,079,437; or 4,089,034. The poled film exhibited a pyroelectric response of 3.9 V/mil-°C. The piezoelectric constants, d$_{31}$ and d$_{32}$, were found to be equal at a value of d$_{31}$=d$_{32}$=3$p$C/N. In defining the piezoelectric constants the convention of calling the knife coater direction 1, the transverse direction 2, and the direction perpendicular to the plane of the film 3 was employed, and pC is picocoulombs, N is newtons, and d is the piezoelectric constant.

EXAMPLE 7

A solution of polyvinylidene fluoride (Solef® 1012, 70 percent by weight) and polymethylmethacrylate (Rohm & Haas Acryloid® A-11, 30 percent by weight) in dimethyl formamide was prepared at a solids content of 20 percent by weight. This solution was coated onto 0.6 mil aluminum foil, using a 6 inch knife coater, dried at 275° F. for 15 minutes, heated to 425° F. for 10 minutes, and subsequently cooled rapidly. Sections of the resulting film, about 0.9 mil in thickness, were poled as described in U.S. Pat. Nos. 4,067,056; 4,079,437; or 4,089,034. The pyroelectric output, volts per °C., of the sections was evaluated, as were the wide angle X-ray scattering curves in the region of 2$\theta$ from 14° to 24°. The films exhibited crystalline scattering peaks at 2$\theta$=21°. This peak is characteristic of the $\beta$-crystalline morphology. The integrated crystalline intensities of these peaks is arbitrary, but self-consistent units correlate with the pyroelectric output as shown in the table below:

| Sample | I$_c$ | Pyroelectric output (V/°C.) |
|---|---|---|
| 1 | 3.90 | 4.30 |
| 2 | 3.86 | 4.28 |
| 3 | 1.98 | 1.63 |
| 4 | 1.34 | .11 |

EXAMPLE 8

A blend of 70 percent by weight polyvinylidene fluoride (experimental Pennwalt resin—Kynar® 960) and 30 percent by weight poly methylmethacrylate/methylmethacrylate-ethyl methacrylate copolymer (Dupont Lucite® 147K) was obtained by melt blending in an extruder. A 4 mil thick film was obtained from the extrudate by reheating to 220° C. and forming in a press. This film was removed from the press and rapidly cooled by dipping into ice water to prevent crystallization. The film was then poled as described in U.S. Pat. Nos. 4,067,056; 4,079,437; or 4,089,034. The poled film exhibited a pyroelectric response of 0.8 V/mil-°C.

EXAMPLE 9

Thirty-four grams of dimethylformamide were added to 6.0 grams polyvinylidene fluoride (Pennwalt Kynar® 301F), and the mixture was agitated for 2 hours at ambient temperature to dissolve the resin. Ten grams of 40 percent by weight polymethylmethacrylate in methylethylketone (Rohm and Haas Acryloid® A-101) were then added and the mixture was agitated for an hour at ambient temperature to yield a 60 to 40 weight ration of PVF$_2$ to PMMA at a combined concentration of 20 percent by weight in the total solution.

A film was cast from a portion of the resulting milky solution onto 0.7 mil thick aluminum foil using an 18 inch knife coater. The coated foil was immediately placed on an 150° C. hot plate for 10 minutes to drive off most of the DMF, then placed in a 150° C. oven for 20 minutes and then rapidly cooled to room temperature.

Gold was sputtered onto the resulting approximately one mil thick coating to form an electrode for poling. The coated foil was heated in an oven to 105° C. over a 12 minute interval with 1,250 volts applied between the gold electrode and the aluminum foil substrate. The coated foil was held at this temperature and voltage conditions for 60 minutes and then cooled to below 50° C. over a 15 minute period while the voltage was maintained. The measured pyroelectric output was 2.6 volts per °C.

EXAMPLE 10

Polyvinylidene fluoride (Pennwalt Kynar ® 301F) and polymethylmethacrylate (Rohm and Haas Acryloid ® A-11) were combined in 60 to 40 ratio by weight, respectively, and mixed with sufficient dimethylformamide to provide a concentration of 6.67 percent by weight of the combined resins in solution.

The resulting solution was filtered and then distributed from a hypodermic syringe over the surface of a silicon IC (integrated circuit) slice. The IC slice was then placed in a container, and the container was heated by infrared lamps and purged with nitrogen to drive off most of the DMF solvent.

The coated IC slice was transferred to a 150°–200° C. oven for 40 minutes and was then rapidly cooled to room temperature.

Gold was sputtered onto the resultant approximately 0.6 mil average thickness coating to form an electrode for poling. The coated IC slice was then heated in an oven to 120° C. over a 10 minute period while a potential of 600 to 750 volts was applied between the gold electrode and the silicon substrate. The coated IC slice was held at these temperature and voltage conditions for 30 minutes and was then cooled to below 86° C. over a 10 minute period while the voltage was maintained. The measured pyroelectric output equaled 1.1 volts per °C. or about 1.9 volts per mil °C.

EXAMPLE 11

Two solutions were prepared at 15 weight percent solids in dimethylformamide; the first containing 70 weight percent Solef ® 5008 polyvinylidene fluoride and 30 weight percent poly N,N-dimethyl acrylamide, commercially available from Polysciences Corp. as PDMA; the second containing 80 weight percent of polyvinylidene fluoride, with the balance being the acrylamide. These solutions were dissolved on a shaker under a sun lamp, following which films were cast by knife coating onto aluminum foil and drying on a conventional hot plate whose surface temperature ranged from 100°–130° C.

The coated foil was transferred to a 150°–200° C. oven for 10 minutes and then rapidly cooled to room temperature. Sections of the resultant film, about 1.2 mils in thickness, were poled as described in U.S. Pat. Nos. 4,067,056; 4,079,437; or 4,089,034. The pyroelectric response of three samples of the 80/20 weight blend were 3.80, 3.81 and 3.46. The pyroelectric response of the 70/30 weight blend were 3.00, 3.35, and 3.40 volts/°C.

EXAMPLE 12

Two solutions were prepared as per Example 11, the first containing 70 percent by weight polyvinylidene fluoride and 30 percent by weight of poly N-vinyl-2-pyrrolidone, commercially available from Aldridge Chemical as No. 85,647-9, and the second containing the same components in an 80 weight percent concentration of polyvinylidene fluoride. Samples were prepared as described in Example 11, and pyroelectric responses measured after poling were, for the 80/20 samples, at a thickness of 2 mils a pyroelectric response of 1.14 volts/°C.; at a thickness of approximately 1.3 mils a pyroelectric response of 1.93 and 1.36. Similarly, the 70/30 weight blend, at a thickness of 2 mils displayed a pyroelectric response of 2.28 volts/°C. and at 1.5 mils thickness, 0.94 volts/°C.

What is claimed is:

1. A non-mechanically oriented polymeric film having stable pyroelectric and isotropic piezoelectric properties comprising a blend of polyvinylidene fluoride and at least one polymer which is miscible with said polyvinylidene fluoride, said blend having been maintained in an amorphous state prior to poling, said pyroelectric and isotropic piezoelectric properties displaying polarization of at least about 0.5 volts/°C.-mil.

2. The polymeric film of claim 1 wherein said polyvinylidene fluoride comprises at least about 50 percent by weight of said blend.

3. The polymeric film of claim 1 wherein said polymer is selected from the group consisting of acrylate polymers, methacrylate polymers, polyvinyl acetate, poly N,N-dimethyl acrylamide, polyvinyl methyl ketone, poly N-vinyl-2-pyrrolidone, and mixtures thereof.

4. The polymeric film of claim 1 further containing a thin metallic coating on at least one surface thereof.

* * * * *

UNITED STATES PATENT AND TRADEMARK OFFICE
CERTIFICATE OF CORRECTION

PATENT NO. : 4,820,586

DATED : April 11, 1989

INVENTOR(S) : Krueger et al.

It is certified that error appears in the above-identified patent and that said Letters Patent is hereby corrected as shown below:

Column 4, line 11, "includes" should be --include--.

Column 6, line 27, "heaed" should be --heated--.

Signed and Sealed this

Thirtieth Day of January, 1990

*Attest:*

JEFFREY M. SAMUELS

*Attesting Officer*    *Acting Commissioner of Patents and Trademarks*